US007038925B1

(12) United States Patent
Ohbayashi

(10) Patent No.: US 7,038,925 B1
(45) Date of Patent: May 2, 2006

(54) STATIC SEMICONDUCTOR MEMORY DEVICE HAVING T-TYPE BIT LINE STRUCTURE

(75) Inventor: Shigeki Ohbayashi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 707 days.

(21) Appl. No.: 09/829,046

(22) Filed: Apr. 10, 2001

(30) Foreign Application Priority Data

Dec. 18, 2000 (JP) ...................................... 2000-383164

(51) Int. Cl.
*G11C 5/06* (2006.01)

(52) U.S. Cl. ........................... 365/63; 365/51; 365/154

(58) Field of Classification Search .................. 365/51, 365/63, 200, 225.7, 154
See application file for complete search history.

(56) References Cited

U.S. PATENT DOCUMENTS 5,699,308 A 12/1997 Wada et al.
5,808,930 A * 9/1998 Wada et al. .................. 365/63
5,896,340 A * 4/1999 Wong et al. ........... 365/230.03
6,009,010 A * 12/1999 Ohkubo ...................... 365/154
6,088,276 A 7/2000 Ukita ......................... 365/207
6,288,925 B1 * 9/2001 Kitsukawa .................. 365/63
6,317,353 B1 * 11/2001 Ikeda et al. .................... 35/63

FOREIGN PATENT DOCUMENTS

JP 5-63091 3/1993
JP 9-162305 6/1997
JP 9-270468 10/1997
JP 11-306762 11/1999

OTHER PUBLICATIONS

"A 14–ns 1–Mbit CMOS SRAM with Variable Bit Organization", by Kohno et al., IEEE Journal of Solid–State Circuits, vol. 23, No. 5 (Oct. 1988), pp. 1060–1066.

* cited by examiner

*Primary Examiner*—Son Mai
(74) *Attorney, Agent, or Firm*—McDermott Will & Emery LLP

(57) ABSTRACT

Above a memory block including horizontal memory cells in 8 rows by 256 columns, a total of eight lines, a global word line, a bit line load power supply line, a local data input/output line pair, a bit line signal input/output line pair, a memory cell power supply line and a global column selecting line are, arranged at equal intervals. Since provision of one line is enough per one memory cell row, an SRAM having a T-type bit line structure can be realized with ease using horizontal memory cells to enable reduction of a layout area and speed-up of an operation rate.

7 Claims, 14 Drawing Sheets

3

STATIC SEMICONDUCTOR MEMORY DEVICE HAVING T-TYPE BIT LINE STRUCTURE

BACKGROUND OF THE INVENTION

1. Field of the Invention

The present invention relates to a static semiconductor memory device and, more particularly, to a static semiconductor memory device having a T-type bit line structure.

2. Description of the Related Art

Among conventional static random access memories (hereinafter referred to as SRAM), the mainstream is a memory cell of a high resistance and load type or a TFT load type having four transistors and two loads because it requires a small memory cell layout area. These memory cells, however, have lost their popularities as a power supply voltage of an SRAM has been decreased from 3 V to 2.5 V, 1.8 V and down to 1.5 V because they are not excellent in low-voltage operation characteristics, while a full CMOS cell having six transistors excellent in low-voltage operation characteristics is gaining a popularity.

FIG. 13A is a circuit diagram showing a structure of such a full CMOS memory cell MC. In FIG. 13A, the memory cell MC includes load transistors (P channel MOS transistors) 81 and 82, driver transistors (N channel MOS transistors) 83 and 84 and access transistors (N channel MOS transistor) 85 and 86.

In writing operation, one of a pair of bit lines BL and /BL is brought to a logical high or "H" level and the other is brought to a logical low or "L" level according to write data. Next, a word line WL is brought to a "H" level of a selected level to render the N channel MOS transistors 85 and 86 conductive, so that the levels of the bit line pair BL, /BL are applied to storage nodes N1 and N2, respectively. When the word line WL is brought to a "L" level of a non-selected level, the N channel MOS transistors 85 and 86 are rendered non-conductive, so that the levels of the storage nodes N1 and N2 are latched by the. MOS transistors 81 to 84.

In reading operation, each of the bit line pair BL, /BL is charged to the "H" level. Subsequently, the word line WL is brought to the "H" level of the selected level to render the N channel MOS transistors 85 and 86 conductive, so that according to the levels of the storage nodes N1 and N2, current flows from one of the bit lines BL and /BL to a memory cell ground line MGL through the N channel MOS transistors 85 and 83 or 86 and 84. By comparing the levels of the bit lines BL and /BL, storage data of the memory cell MC is read. When the word line WL is brought to the "L" level of the non-selected level, the N channel MOS transistors 85 and 86 are rendered non-conductive to end data reading.

FIG. 13B is a diagram showing layout of the memory cell MC. On the surface of a silicon substrate, two gate electrodes GE1 and GE2 extending in the Y direction in the figure are formed in parallel to each other, while the word line WL extending in the X direction in the figure is formed. The gate electrodes GE1 and GE2 and the word line WL are formed of a polysilicon layer. From one side to the other side of one end portion of the gate electrodes GE1 and GE2, P-type active layers PA1 and PA2 are formed. From one side to the other of the other end portion of the gate electrode GE1 and from one side to the other of one end portion of the word line WL, an N-type active layer NA1 is formed. From one side to the other of the other end portion of the gate electrode GE2 and from one side to the other of the other end portion of the word line WL, an N-type active layer NA2 is formed.

The P-type active layer PA1 and the gate electrode GE1, and the P-type active layer PA2 and the gate electrode GE2 form the P channel MOS transistors 81 and 82, respectively. The N-type active layer NA1 and the gate electrode GE1, and the N-type active layer NA2 and the gate electrode GE2 form the N channel MOS transistors 83 and 84, respectively. The N-type active layer NA1 and the word line WL, and the N-type active layer NA2 and the word line WL form the N channel MOS transistors 85 and 86, respectively.

Next, a plurality of local lines LL are formed. In FIG. 13B, at a part where the local line LL and the active layer overlap each other, the local line LL and the active layer are conductive to each other. One end portion of each of the active layers PA1 and PA2 (sources of the P channel MOS transistors 81 and 82) is connected to a memory cell power supply line MVL. The memory cell power supply line MVL is formed of a local line LL1.

The other end portion of the P-type active layer PA1 (drain of the P channel MOS transistor 81) is connected to the central part of the N-type active layer NA1 (drains of the N channel MOS transistors 83 and 85) through a local line LL2. The other end portion of the P-type active layer PA2 (drain of the P channel MOS transistor 82) is connected to the central part of the N-type active layer NA2 (drains of the N channel MOS transistors 84 and 86) through a local line LL3. The local lines LL2 and LL3 are connected to the gate electrodes GE2 and GE1 through contact holes CH, CH, respectively.

Furthermore, by a first aluminum line layer, a bit line pair BL, /BL and memory cell ground lines MGL, MGL extending in the Y direction in the figure are formed in parallel to each other. Ones of the ends of the N-type active layers NA1 and NA2 (sources of the N channel MOS transistors 83 and 84) are connected to the memory cell ground lines, MGL, MGL through the contact holes CH, CH. The others of the ends of the N-type active layers NA1 and NA2 (drains of the N channel MOS transistors 85 and 86) are connected to the bit lines BL and /BL through the contact holes CH, CH, respectively.

In such an SRAM, an alien substance might attach to a memory cell MC during manufacturing to cause short circuit (1) between the storage nodes N1 and N2, (2) between the storage node N1 or N2 and the memory cell power supply line MVL, (3) between the storage node N1 or N2 and the memory cell ground line MGL, (4) between the storage node N1 or N2 and the word line WL, (5) between the storage node N1 or N2 and the bit line BL or /BL, (6) between the ,bit line BL or /BL and the word line WL, (7) between the word line WL and the memory cell power supply line MVL, (8) between the bit line BL or /BL and the memory cell ground line MGL and (9) between the memory cell power supply line MVL and the memory cell ground line MGL. In the memory cell MC shown in FIGS. 13A and 13B, since the bit line pair BL, /BL and the memory, cell ground lines MGL, MGL are arranged adjacent and in parallel to each other, short circuit is liable to occur at a part of (8) in particular.

The memory cell MC in which such short circuit occurs fails to operate normally. The SRAM therefore employs a redundant system in which a spare row or column to replace a row or a column containing a defective memory cell MC and a program circuit for programming an address in a defective row or column are provided to, when an address of a defective row or column is input, select the spare row or column in place of the defective row or column, thereby remedying defective products.

Simply replacing a defective row or column with the spare row or column results in that leakage current continues flowing at a shorted part, so that standby current covers a standard value. Therefore, employed is such a method of reducing standby current by providing a fuse between the memory cell power supply line MVL in each row or column and a line of a power supply potential VDD, or a fuse between the bit line pair BL, /BL in each column and the line of the power supply potential VDD and blowing a fuse in a defective row or column.

In a conventional SRAM, however, since a bit line load circuit, a sense amplifier, a gate circuit and a fuse concentrate on an end portion of the bit line pair BL, /BL narrowing an interval between lines of the bit line pair BL, /BL is difficult. Under these circumstances, a so-called T-type bit line structure has been proposed (see Japanese Patent Laying-Open No. 9-162305 and Japanese Patent Laying Open No. 11-306762).

In an SRAM having the T-type bit line structure, a memory array region is divided into a plurality of memory blocks arranged in a plurality of rows and columns. Each memory block, as shown in FIGS. 14A and 14B, includes a plurality of memory cells MC arranged in four rows and a plurality of columns (four columns in the figure). In each memory block, a global word line GWL, a local data input/output line LIO, a bit line signal input/output line BL', a bit line signal input/output line /BL', a local data input/output line /LIO and a global column selecting signal GYL extending in the X direction in the figure are formed of a second aluminum line layer. These six lines GWL, LIO, BL', /BL', /LIO, and GYL are formed at equal intervals above memory cells MC in four rows included in each memory block. The bit line signal input/output line pair BL', /BL' is connected through contact holes CH, CH to a bit line pair BL, /BL of a corresponding column, respectively.

In the SRAM, a bit line load circuit, a sense amplifier, a gate circuit, a fuse and the like can be arranged at an end portion of the bit line signal input/output line pair BL', /BL', an interval between the lines of the bit line pair BL, /BL can be reduced to enable reduction in an layout area.

In the longitudinal memory cell MC shown in FIGS. 13A and 13B, however, a ratio of a length of the memory cell MC in a direction of the word line WL to a length of the same in a direction of the bit line pair BL, /BL is approximately 2 to 3. On the other hand, a horizontal memory cell MC is also proposed having a ratio of a length of a memory cell MC in the direction of the word line WL to a length of the same in the direction of the bit line pair BL, /BL is approximately 3 to 1 (see Japanese Patent Laying-Open No. 9-270468). In this horizontal memory cell MC, since the length in the direction of the bit line pair BL, /BL is shorter than that in the direction of the word line WL, it is possible to suppress a signal delay caused by the bit line pair BL, /BL to speed up reading/writing.

In a case where a longitudinal memory cell MC and a horizontal memory cell MC are laid out according to the same design rules, however, while in the longitudinal memory cell MC, 1.5 lines (six lines GWL, LIO, BL', /BL', /LIO and GYL per four memory cells) can be arranged per one memory cell row, in the horizontal memory cell MC, 1.0 line can be arranged per one memory cell row at the most. In other words, when a horizontal memory cell MC is adopted, it is impossible to form an SRAM having the T-type bit line structure by adopting such layout as shown in FIGS. 14A and 14B.

SUMMARY OF THE INVENTION

Accordingly, a main object of the present invention is to provide a static semiconductor memory device whose layout area is small and whose operation rate is high.

A static semiconductor memory device according to the present invention is provided with a number M×N of memory blocks which are arranged in M rows by N columns and each of which include a number 8×M of horizontal memory cells arranged in 8 rows by M columns, M×N pairs of first and second bit line signal input/output lines, M sets of first and second data input/output lines, first and second power supply lines, global word lines and global column selecting lines, a selection circuit responsive to an address signal for selecting one of the number M×N of memory blocks and one of the number 8×M of memory cells belonging to the selected memory block, a write/read circuit and a gate circuit for coupling a memory cell selected by the selection circuit to the write/read circuit, in which in each memory block, the above-described eight lines are arranged above eight memory cell rows of the memory block and the first and the second power supply lines are arranged between the global word line and the global column selecting line, and the remaining four lines, respectively. Accordingly, since it is only necessary to provide one line above one memory cell row, an SRAM having the T-type bit line structure can be formed with ease using a horizontal memory cell, which enables reduction in a layout area and speed-up of an operation rate. In addition, since the first and the second power supply lines are arranged between the global word line and the global column selecting line for transmitting a high amplitude signal, and the other four lines for transmitting a low amplitude signal, coupling noise between the lines can be reduced.

Preferably, the M pairs of the first and the second power supply lines are provided corresponding to the M pairs of the first and the second bit lines in each memory block column and the static semiconductor memory device of the present invention is further provided with a bit line load circuit provided corresponding to each memory block for supplying a power supply potential applied through the corresponding first power supply line to the corresponding first and second bit line signal input/output lines, and a third power supply line provided corresponding to each of the first and second bit lines for supplying a power supply potential applied through the corresponding second power supply line to each corresponding memory cell. In this case, effective use of the first and the second power supply lines can be attained.

More preferably, the static semiconductor memory device of the present invention is provided with a first switching element provided corresponding to each first power supply line and having one electrode connected to the corresponding first power supply line and the other electrode receiving the power supply potential; a second switching element provided corresponding to each second power supply line and having one electrode connected to the corresponding second power supply line and the other electrode receiving the power supply potential, and a first program circuit provided corresponding to each of the first and second power supply lines and includes a first fuse which is to be blown when the corresponding memory cell column is defective, and responsive to the blowing of the first fuse for rendering the corresponding first and second switching elements non-conductive. In this case, by blowing the first fuse of the first program circuit corresponding to a defective memory cell column, the first and the second switching elements are rendered non-conductive to bring the corresponding first and second power supply lines to a floating state. As a result, current leakage from the first power supply line to a shorted part of a memory cell can be prevented to reduce current.

More preferably, the selection circuit includes a global column decoder responsive to an address signal for selecting one of the number M of global column selecting lines to bring the global column selecting line to a selected level and a global row decoder responsive to an address signal for selecting one of the number M of global word lines to bring the global word line to the selected level, and the first program circuit further controls the global column decoder in response to the first fuse being blown to fix the corresponding global column selecting line at a non-selected level. In this case, when the global column selecting line and other line are short-circuited, current leakage through the shorted part can be prevented.

More preferably, other part of the first program circuit than the first fuse and the global column decoder are arranged between the first fuse and a memory block. In this case, since a distance between the first fuse and the memory cell is set to be large, exertion of the effects of laser blow onto the memory cell can be prevented.

More preferably, the static semiconductor memory device of the present invention is further provided with a second program circuit provided corresponding to each global word line and including a second fuse which is to be blown when the corresponding memory block row is defective, and responsive to blowing of the second fuse for controlling the global row decoder to fix the corresponding global word line at the non-selected level. In this case, when the global word line and other line are shorted, current leakage through the shorted part can be prevented.

More preferably, other parts of the first and the second program circuits than the first and second fuses and the global column decoder and the global row decoder are arranged between the first and second fuses and the memory block. In this case, since a distance between the first and second fuses and the memory cell is set to be large, exertion of the effects of laser blow onto the memory cell can be prevented.

The foregoing and other objects, features, aspects and advantages of the present invention will become more apparent from the following detailed description of the present invention when taken in conjunction with the accompanying drawings.

REFERRED EMBODIMENTS OF THE PRESENT INVENTION

Figure 1:
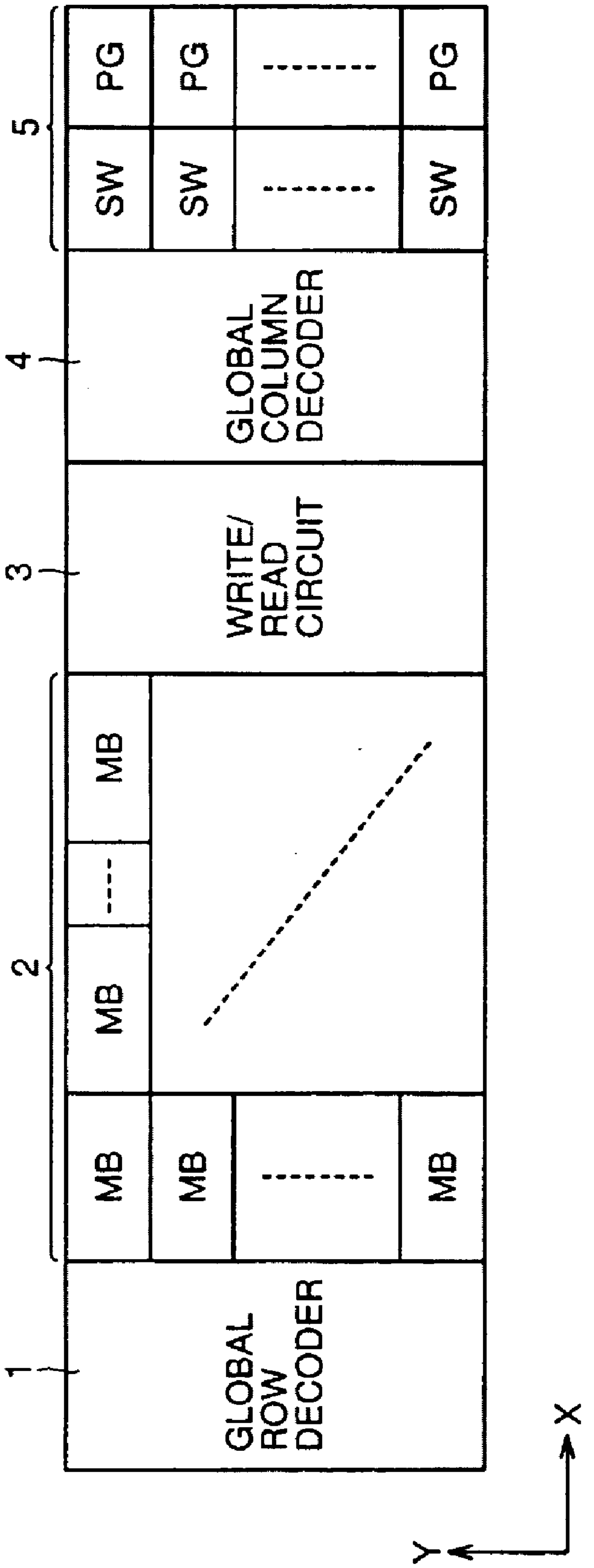
FIG. 1 is a block diagram showing layout of an SRAM according to one embodiment of the present invention.

FIG. 1 is a diagram showing layout of an SRAM according to one embodiment of the present invention. In FIG. 1, the SRAM includes a global row decoder 1, a memory array region 2, a write/read circuit 3, a global column decoder 4 and a power supply control circuit 5 arranged in order in the X direction in the figure.

The memory array region 2 is divided into 2048 memory blocks MB arranged in 256 rows by 8 columns. Each memory block MB includes memory cells in 8 rows by 256 columns. In the memory array region 2, 4M bits of data can be stored. In each memory block MB column, two spare columns and 16 spare rows are provided.

Figure 2:
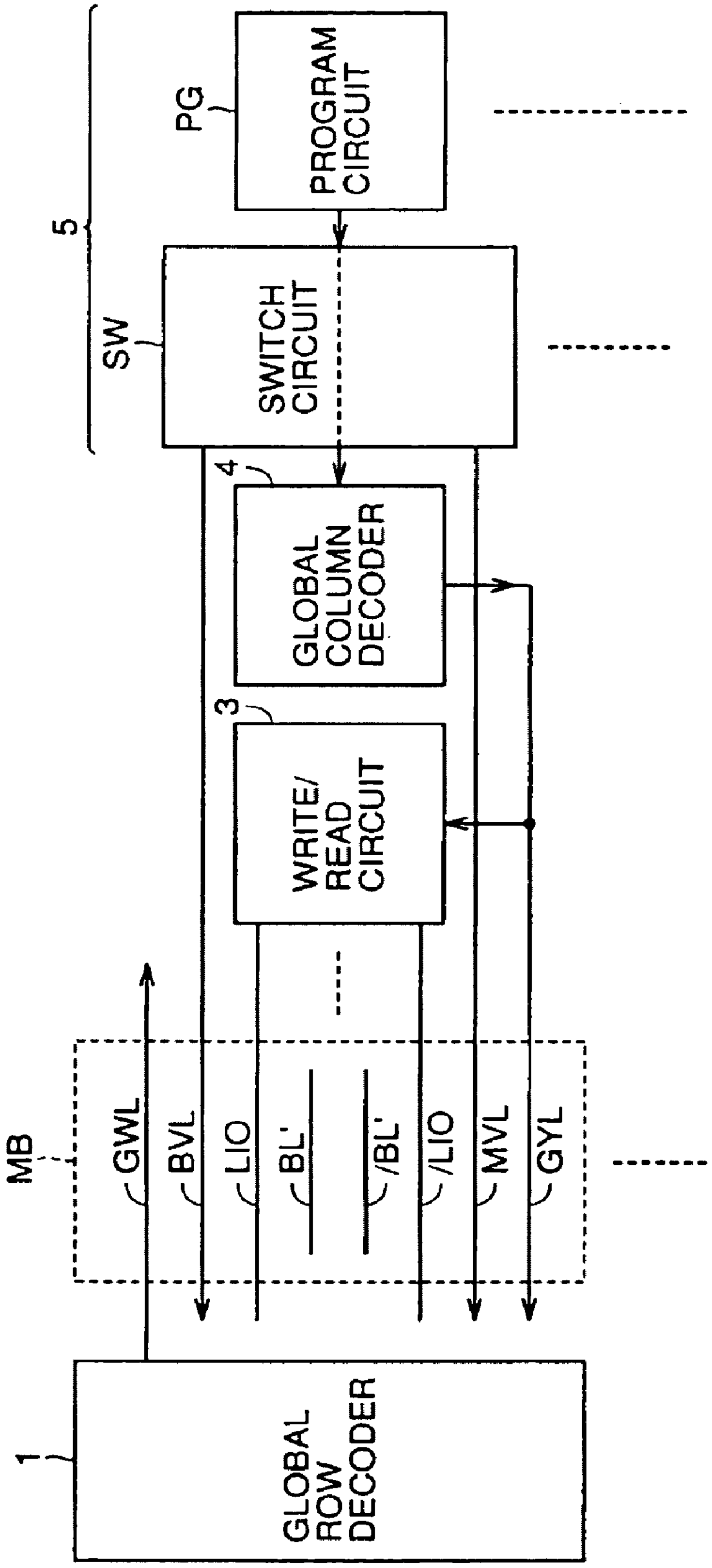
FIG. 2 is a block diagram showing a part related to one memory block row of the SRAM illustrated in FIG. 1.

In each memory block MB row, as illustrated in FIG. 2, a global word line GWL, a bit line load power supply line BVL, a local data input/output line pair LIO, /LIO, a memory cell power supply line MVL and a global column selecting line GYL are provided.

The global row decoder 1 selects one of the 256 global word lines GWL in response to a row address signal to bring the global word line GWL from a logical high or “H” level of a non-selected level down to a logical low or “L” level of a selected level.

The global column decoder 4 selects one of the 256 global column selecting lines GYL to bring the global column selecting line GYL from the “H” level of the non-selected level down to a “L” level of an activation level.

The write/read circuit 3 is connected to one end portion of the 256 local data input/output line pairs LIO, /LIO to conduct data write/read of a memory cell selected through a local data input/output line pair LIO, /LIO in a column corresponding to a global column selecting line GYL selected by the global column decoder 4.

The power supply control circuit 5 includes a switch circuit SW provided corresponding to each of the power supply lines BVL and MVL and a program circuit PG. As will be described later, the power supply lines BVL and MVL are provided corresponding to each memory cell column for supplying a power supply potential VDD' to a bit line load circuit and each memory cell in the corresponding column.

The switch circuit SW is connected between one end of the bit line load power supply line BVL and the memory cell power supply line MVL and a line of the power supply potential VDD'. The program circuit PG includes a fuse to be blown when the corresponding memory cell column is defective and when the fuse is blown, the circuit PG controls the switch circuit SW to stop power supply to the corresponding power supply lines BVL and MVL, as well as controlling the global column decoder 4 to fix the corresponding global column selecting line GYL at the “H” level of the non-selected level.

Figure 3:
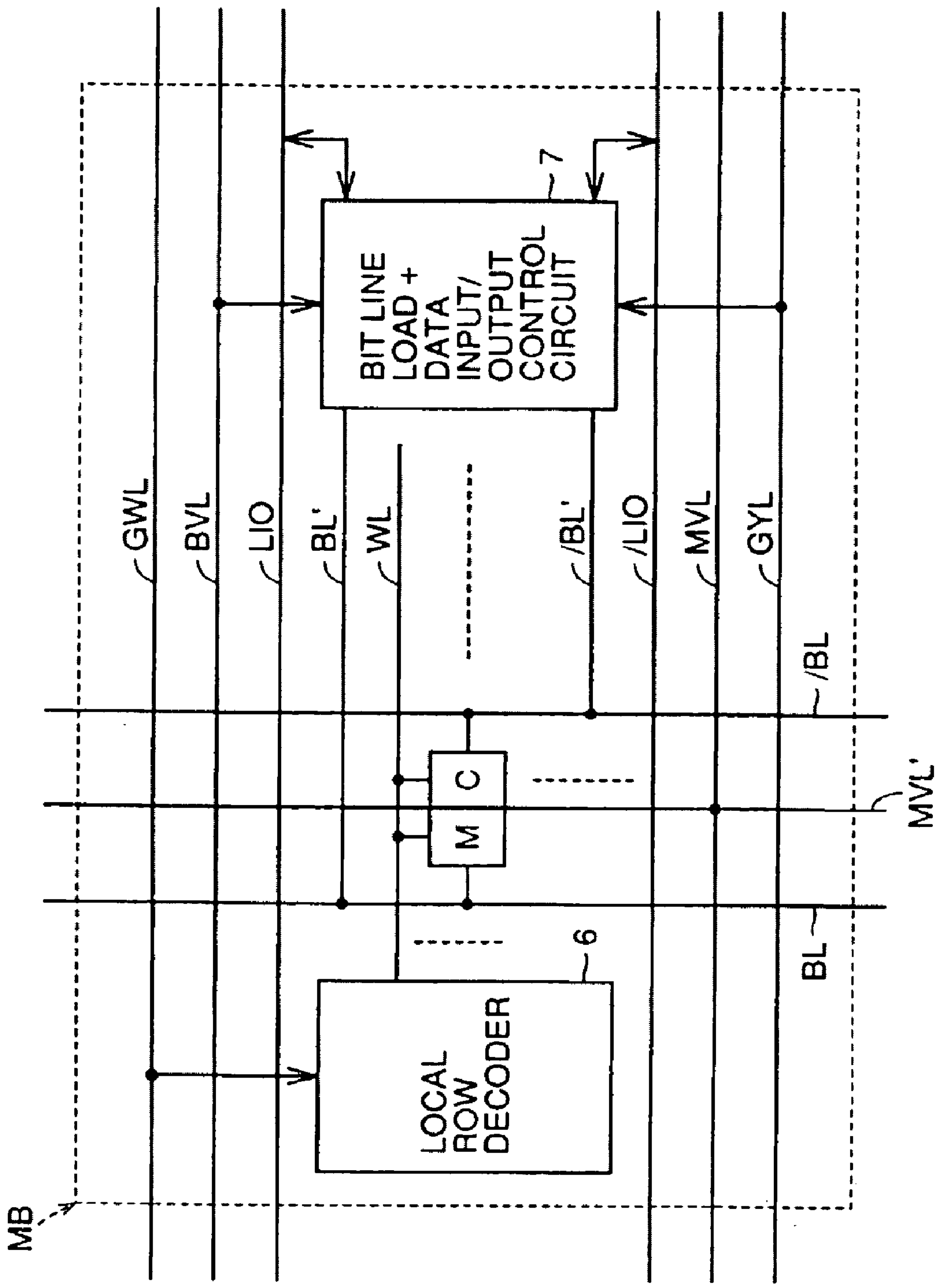
FIG. 3 is a block diagram showing a structure of a memory block illustrated in FIG. 1.

Each memory block MB, as illustrated in FIG. 3, includes horizontal memory cells MC in 8 rows by 256 columns, a word line WL provided corresponding to each row a bit line pair BL, /BL and a sub memory cell power supply line MVL' provided corresponding to each column, a bit line signal input/output line pair BL', /BL' provided corresponding to one column of the 256 columns, and a local row decoder 6 and a bit line load+data input/output control circuit 7. The bit line pair BL, /BL and the sub memory cell power supply line MVL' are provided in common for 256 memory blocks MB in the same column.

One end of the bit line signal input/output line pair BL', /BL' of each memory block MB in the first row is connected to the bit line pair BL, /BL in the first column of the memory block MB in question. The bit line signal input/output line pair BL', /BL' of each memory block MB in the second row is connected to the bit line pair BL, /BL in the second column of the memory block MB in question. This is also the case with the remaining parts. In each memory block MB, the bit line signal input/output line pair BL', /BL' is provided at right angles with the corresponding bit line pair BL, /BL.

In addition, the memory cell power supply line MVL in the first memory block MB row is connected to the sub memory cell power supply line MVL' in the first column of each memory block MB in the row in question. The memory cell power supply line MVL in the second memory block MB row is connected to the sub memory cell power supply line MVL' in the second column of each memory block MB in the row in question. The same is also the case with the remaining part.

Figure 4A:
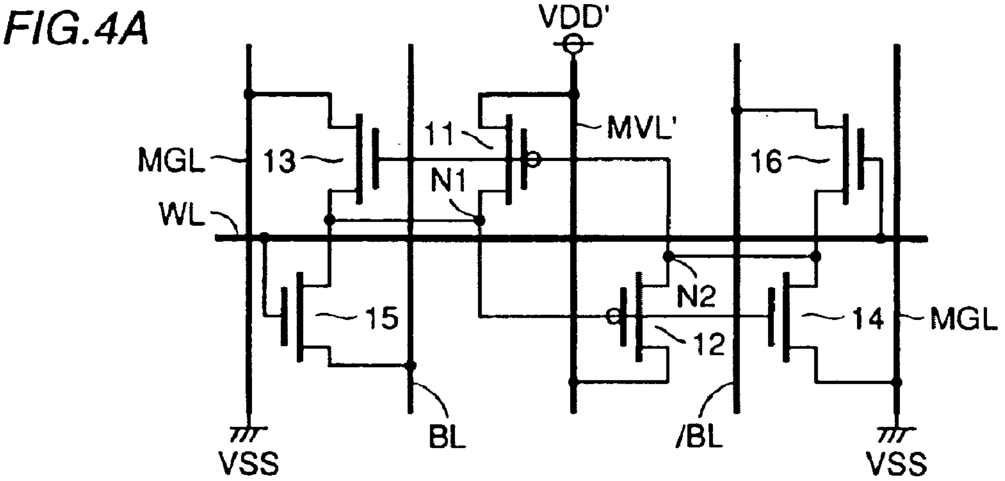
FIGS. 4A to 4C are diagrams showing a structure and layout of a memory cell illustrated in FIG. 3.

In more detail, the horizontal memory cell MC, as illustrated in FIG. 4A, includes load transistors (P channel MOS transistors) 11 and 12, driver transistors (N channel MOS transistors) 13 and 14, and access transistors (N channel MOS transistors) 15 and 16. The P channel MOS transistors 11 and 12 are provided between the sub memory cell power supply line MVL' and a storage node N1 and a storage node N2, respectively, and have gates connected to the nodes N2 and N2, respectively. To the sub memory cell power supply line MVL', the power supply potential VDD' is supplied. The N channel MOS transistors 13 and 14 are connected between the storage nodes N1 and N2 and a memory cell ground line MGL, respectively, and have gates connected to the nodes N2 and N1, respectively. To the memory cell ground line MGL, a ground potential VSS is supplied. The N channel MOS transistors 15 and 16 are connected between the storage nodes N1 and N2 and the bit lines BL and /BL, respectively, and have gates each connected to the word line WL.

In writing operation, one of the lines of the bit line pair BL, /BL is brought to a logical high or "H" level in response to externally applied write data DI, while the other is brought to a logical low or "L" level. Subsequently, the word line WL is brought to an "H" level of the selected level to render the N channel MOS transistors 15 and 16 conductive, so that the levels of the bit line air BL, /BL are applied to the storage nodes N1 and N2, respectively. When the "H" level and the "L" level are applied to the storage nodes N1 and N2, respectively the MOS transistors 11 and 14 are rendered conductive, while the MOS transistors 12 and 13 are rendered non-conductive, so that the levels of the storage nodes N1 and N2 are latched by the MOS transistors 11 to 14. When the "L" level and the "H" level are applied to the storage nodes N1 and N2, respectively, the MOS transistors 12 and 13 are rendered conductive, while the MOS transistors 11 and 14 are rendered nonconductive, so that the levels of the storage nodes N1 and N2 are latched by the MOS transistors 11 to 14. When the word line WL is brought a "L" level of the non-selected level, the N channel MOS transistors 15 and 16 are rendered non-conductive, so that the levels of the storage nodes N1 and N2 are maintained.

In reading operation, each of the bit line pair BL, /BL is charged to the "H" level by the bit line load circuit. When the word line WL is brought to the "H" level of the selected level, the N channel MOS transistors 15 and 16 are rendered conductive. In a case where the "H" level and the "L" level are latched at the storage nodes N1 and N2, respectively, current flows from the bit line /BL to the memory cell ground line MGL through the N channel MOS transistors 16 and 14, so that the bit lines BL and /BL attain the "H" level and the "L" level, respectively. In a case where the "L" level and the T level are latched in the storage nodes N1 and N2, respectively, current flows from the bit line BL to the memory cell ground line MGL through the N channel MOS transistors 15 and 13, so that the bit lines BL, /BL attain the "L" level and the "H" level, respectively. By comparing the levels of the bit lines BL and /BL, storage data of the memory cell MC is read. When the word line WL is brought to the "L" level of the non-selected level, the N channel MOS transistors 15 and 16 are rendered non-conductive to end data reading.

Figure 4B:
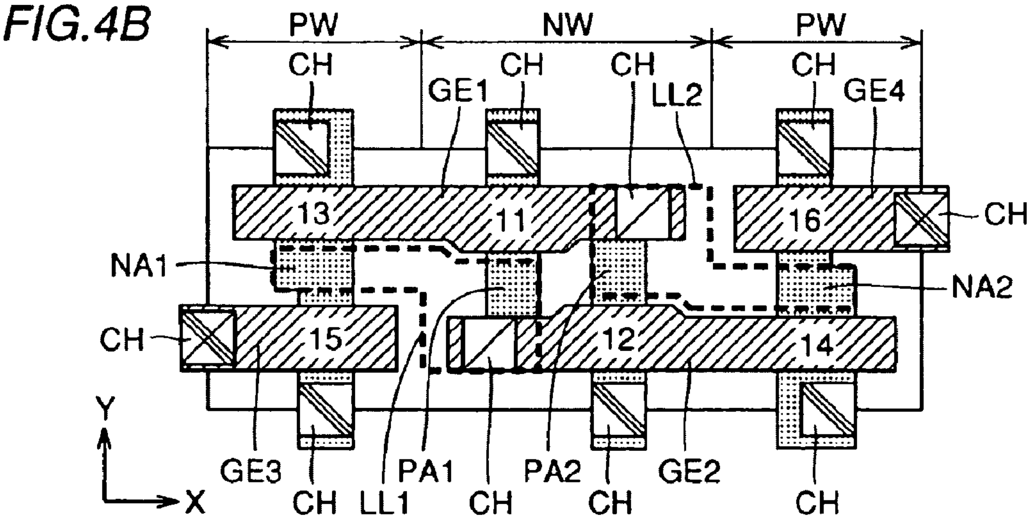
Figure 4C:
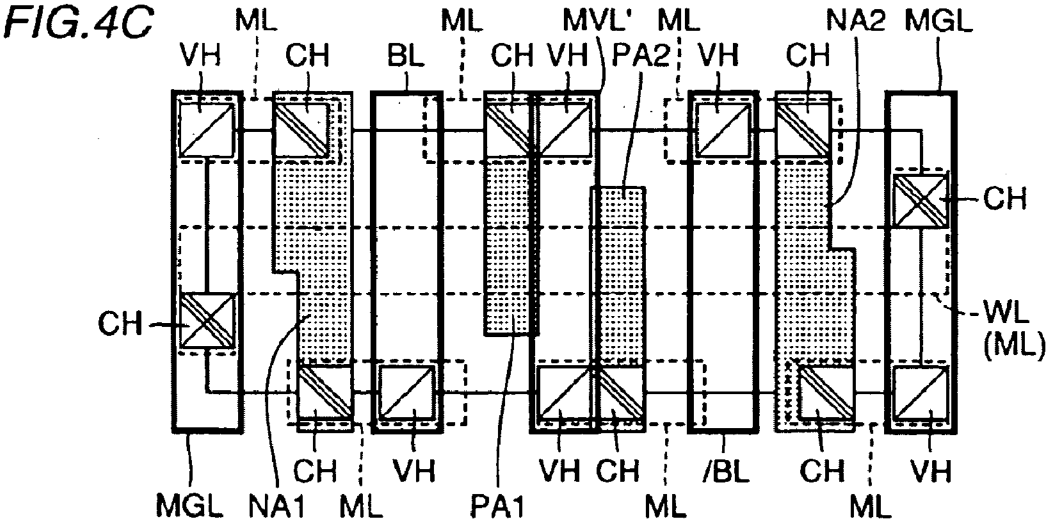

FIGS. 4B and 4C are diagrams showing layout of the horizontal memory cell MC. In FIGS. 4B and 4C, the horizontal memory cell MC is formed on the surfaces of one N type well NW and P type wells PW, PW arranged on the opposite sides thereof. First formed by a polysilicon layer are a gate electrode GE1 extending from the N type well NW to one P type well PW in the X direction in the figure, a gate electrode GE2 extending from the N type well NW to the other P type well PW in the X direction in the figure, a gate electrode GE3 extending on the one P type well PW in the X direction in the figure and a gate electrode GE4 extending on the other P type well PW in the X direction in the figure.

Next, in the one P type well PW, an N type active layer NA1 is formed to cross the gate electrodes GE1 and GE3, in the other P type well PW, an N type active layer NA2 is formed to cross the gate electrodes GE2 and GE4, and in the N type well NW, P type active layers PA1 and PA2 are formed to cross the gate electrodes GE1 and GE2, respectively.

The gate electrode GE1 and the P type active layer PA1, and the gate electrode GE2 and the P type active layer PA2 ,form the P channel MOS transistors 11 and 12, respectively. The gate electrode GE1 and the N type active layer NA1 and the gate electrode GE3 and the N type active layer NA1 form the N channel MOS transistors 13 and 15, respectively. The gate electrode GE2 and the N type active layer NA2, and the gate electrode GE4 and the N type active layer NA2 form the N channel MOS transistors 14 and 16, respectively.

Next, a local line LL1 is formed over the center of the N type active layer NA1 one end portion of the P type active layer PA1 and one end portion of the gate electrode GE2, while a local line LL2 is formed over the center of the N type active layer NA2, one end portion of the P type active layer PA2 and one end portion of the gate electrode GE1. In FIG. 4B, a part at which the local line LL1 and the active layers NA1 and PA1 overlap each other is conductive, and a part at which the local line LL2 and the active layers NA2 and PA2 overlap each other is conductive. The gate electrode GE2 and the local line LL1, and the gate electrode GE1 and the local line LL2 are connected to each other through contact holes CH, CH.

Next, as shown in FIG. 4C, a plurality of metal lines ML extending in the X direction in the figure are formed by a first aluminum line layer and further thereon, the memory cell ground line MGL, the bit line BL, the sub memory cell power supply line MVL', the bit line /BL and the memory cell ground line MGL extending in the Y direction in the figure are formed by a second aluminum line layer. Of the plurality of metal lines ML, a metal line crossing at the center of the memory cell MC will be the word line WL.

One end portion of the P type active layer PA1 (source of the P channel MOS transistor 11) is connected to the sub memory cell power supply line MVL' through the contact hole CH, the metal line ML and a via hole VH. One end portion of the P type active layer PA2 (source of the P channel MOS transistor 12) is connected to the sub memory cell power supply line MVL' through the contact hole CH, the metal line ML and the via hole VH.

One end portion of the N type active layer NA1 (source of the N channel MOS transistor 13) is connected to the memory cell ground line MGL through the contact hole CH, the metal line ML and the via hole VH. One end portion of the N type active layer NA2 (source of the N channel MOS transistor 14) is connected to the memory cell ground line MGL through the contact hole CH, the metal line ML and the via hole VH.

The other end portion of the N type active layer NA1 (drain of the N channel MOS transistor 15) is connected to the bit line BL through the contact hole CH, the metal line ML and the via hole VH. The other end portion of the N type active layer NA2 (drain of the N channel MOS transistor 16) is connected to the bit line BL through the contact hole CH, the metal line ML and the via hole VH. The gate electrodes GE3 and GE4 are connected to the word line WL through the contact holes CH.

Figure 5:
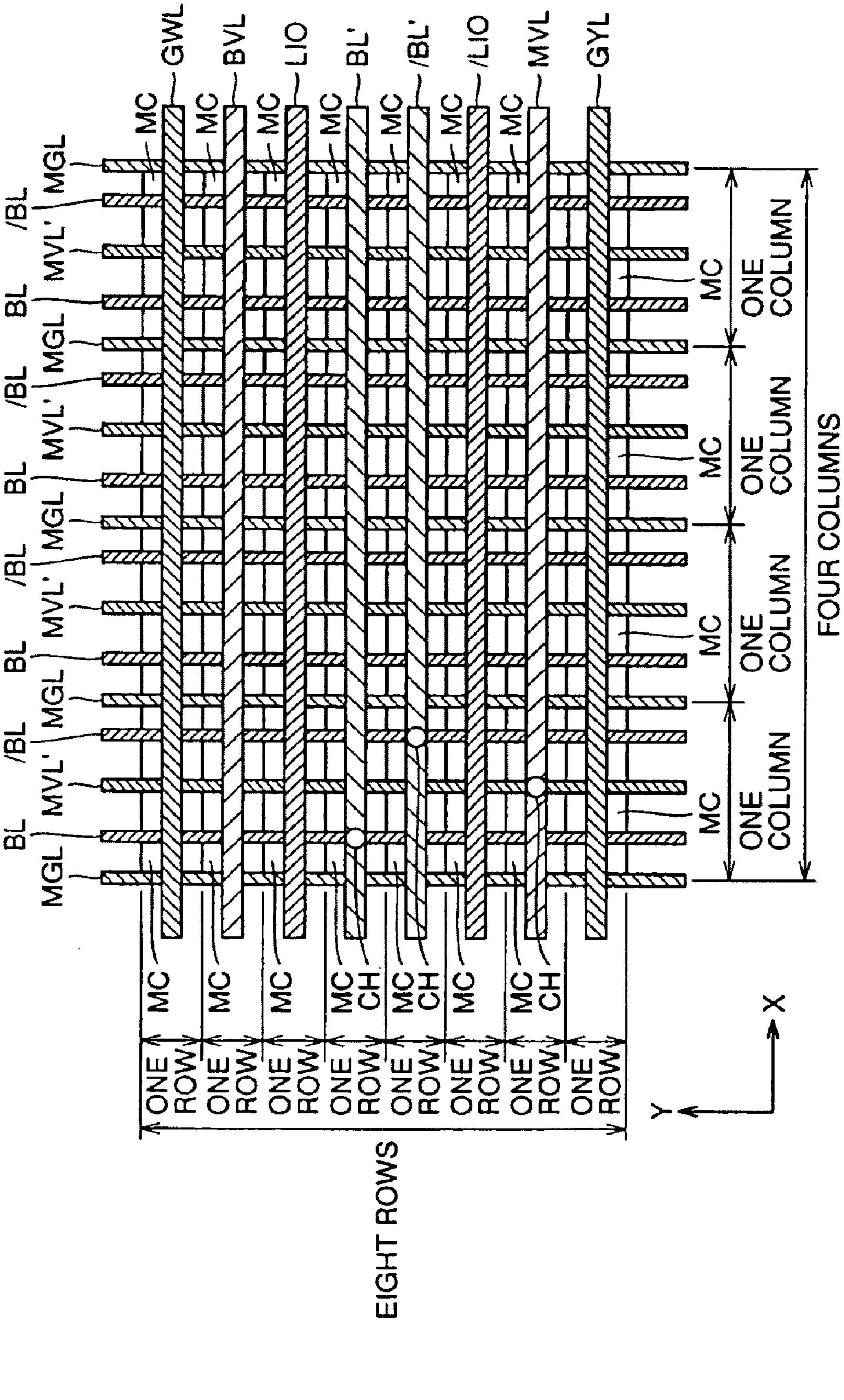
FIG. 5 is a diagram showing layout of a plurality of lines illustrated in FIGS. 2 to 4C.

Next, as shown in FIG. 5, in each memory block MB row, the global word line GWL, the bit line load power supply line BVL, the local data input/output line LIO, the bit line signal input/output line BL', the bit line signal input/output line IBL, the local data input/output line /LIO, the memory cell power supply line MVL and the global column selecting line GYL extending in the X direction in the figure are formed by a third aluminum line layer. These eight lines GWL, BVL, LIO, BL', /BL', /LIO, MVL and GYL are respectively formed above eight memory cell MC rows contained in each memory block MB. The bit line signal input/output line pair BL', /BL' is connected to the bit line pair BL, /BL in the corresponding column through the contact holes CH, CH. The memory cell power supply line MVL is connected to the sub memory cell power supply hue MVL' in the corresponding column through the contact, hole CH.

Figure 6:
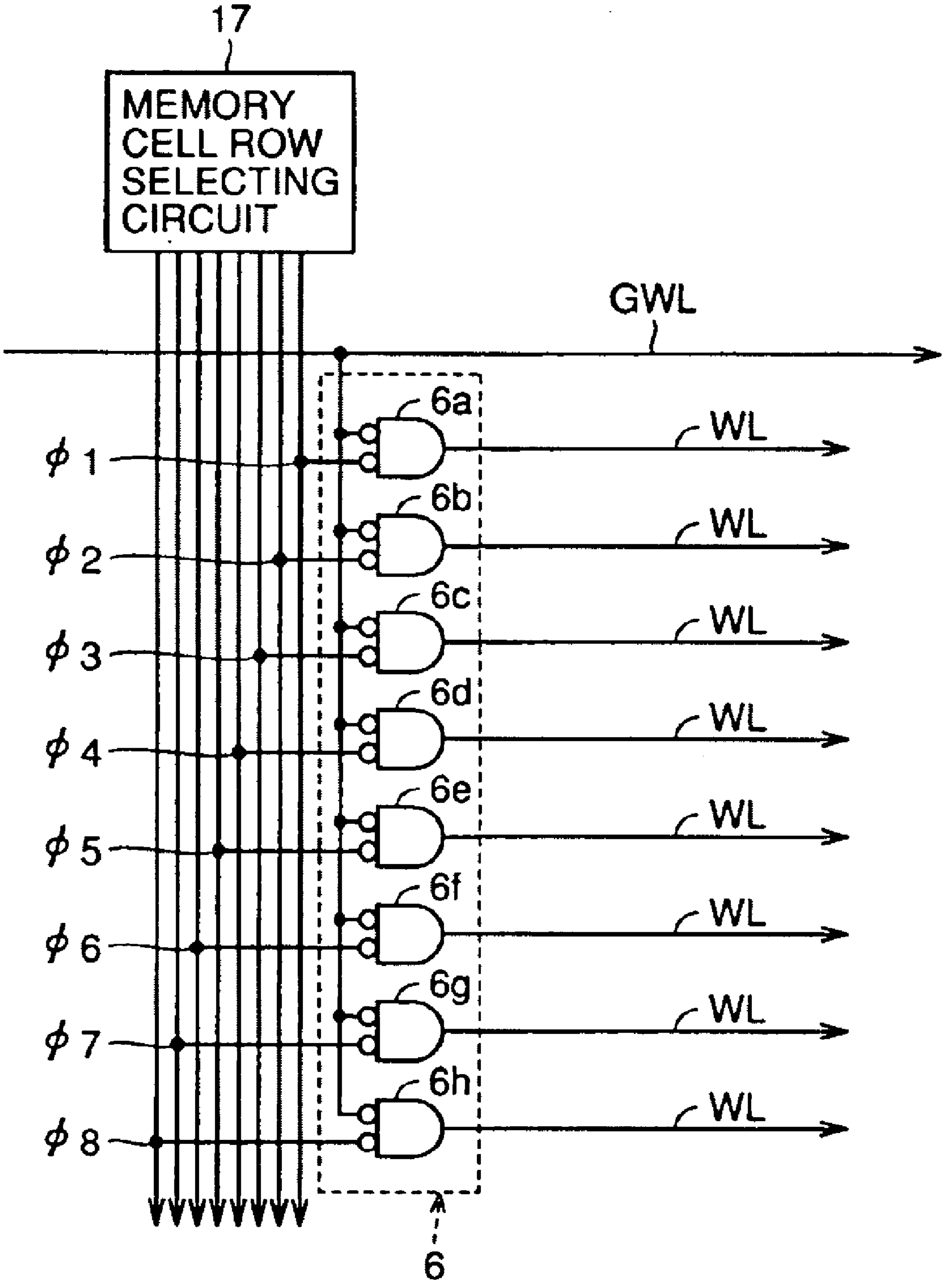
FIG. 6 is a circuit diagram showing a structure of a local row decoder illustrated in FIG. 3.

Return to FIG. 3, the local row decoder 6 is activated in response to the corresponding global word line GWL being brought to the "L" level of the selected level to select one of the eight word lines WL contained in the corresponding memory block MB and raise the word line WL from the "L" level of the non-selected level to the "H" level of the selected level. In other words, the local row decoder 6 includes eight NOR gates 6*a* to 6*h* provided corresponding to the respective eight word lines WL as shown in FIG. 6. Ones of the respective input nodes of the NOR gates 6*a* to 6*h* are connected to the global word line GWL and the others of the input nodes receive row selecting signals ϕ1 to ϕ8, respectively, and the respective output nodes are connected to the eight word lines WL. The row selecting signals ϕ1 to ϕ8 are signals generated by a memory cell row selecting circuit 17 based on a row address signal. When the global word line GWL attains the "L" level of the selected level and one (e.g. ϕ1) of the row selecting signals ϕ1 to ϕ8 attains the "level" of the selected level, the word line WL corresponding to the signal ϕ1 attains the "H" level of the selected level.

Figure 14B:
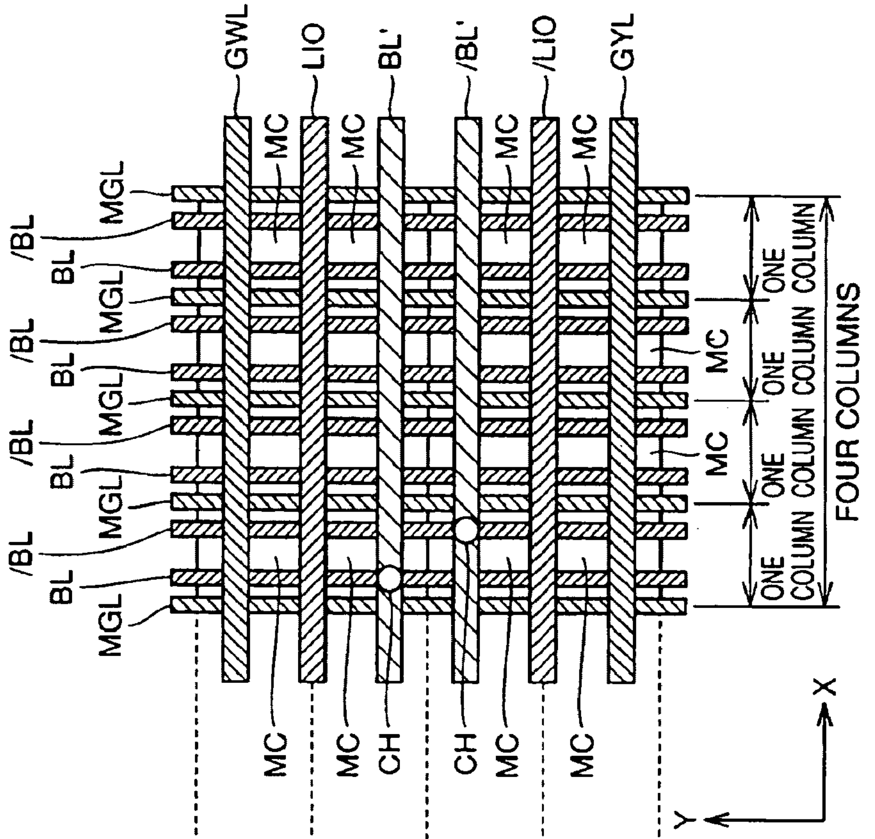
FIGS. 14A and 14B are diagrams showing a main part of a conventional SRAM having a T-type bit line structure.
Figure 14A:
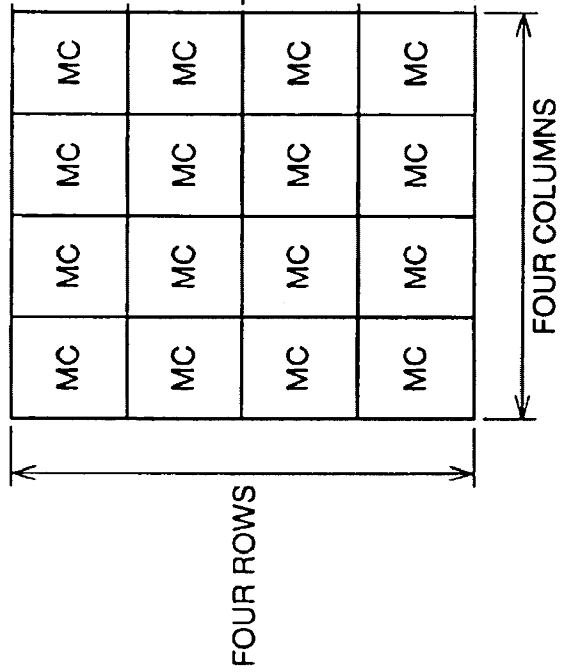

"JSSC vol. 23, No. 5, Oct. 1988, pp 1060–1066 discloses that a layout width of a row decoder depends on the number of row selecting signals, that it has little difference between a case where the number of row selecting signals is four and a case where the same is eight and that the difference is drastically increased when the number exceeds eight. In the SRAM according to the present embodiment, therefore, since the number of the row selecting signals ϕ1 to ϕ8 is eight, an layout area of the row decoder 6 has little difference from that of a row decoder of the conventional SRAM shown in FIGS. 14A and 14B.

Again return to FIG. 3, the bit line load+data input/output control circuit 7 precharges the bit line pair BL, /BL in the corresponding column through the bit line signal input/output line pair BL', /BL' to the "H" level and in reading operation, amplifies a potential difference between the bit line signal input/output line pair BL', /BL' and applies the amplification to the local data input/output line pair LIO, /LIO and in writing operation, couples the local data input/output line pair LIO, /LIO and the bit line signal input/output line pair BL', /BL'.

Figure 7:
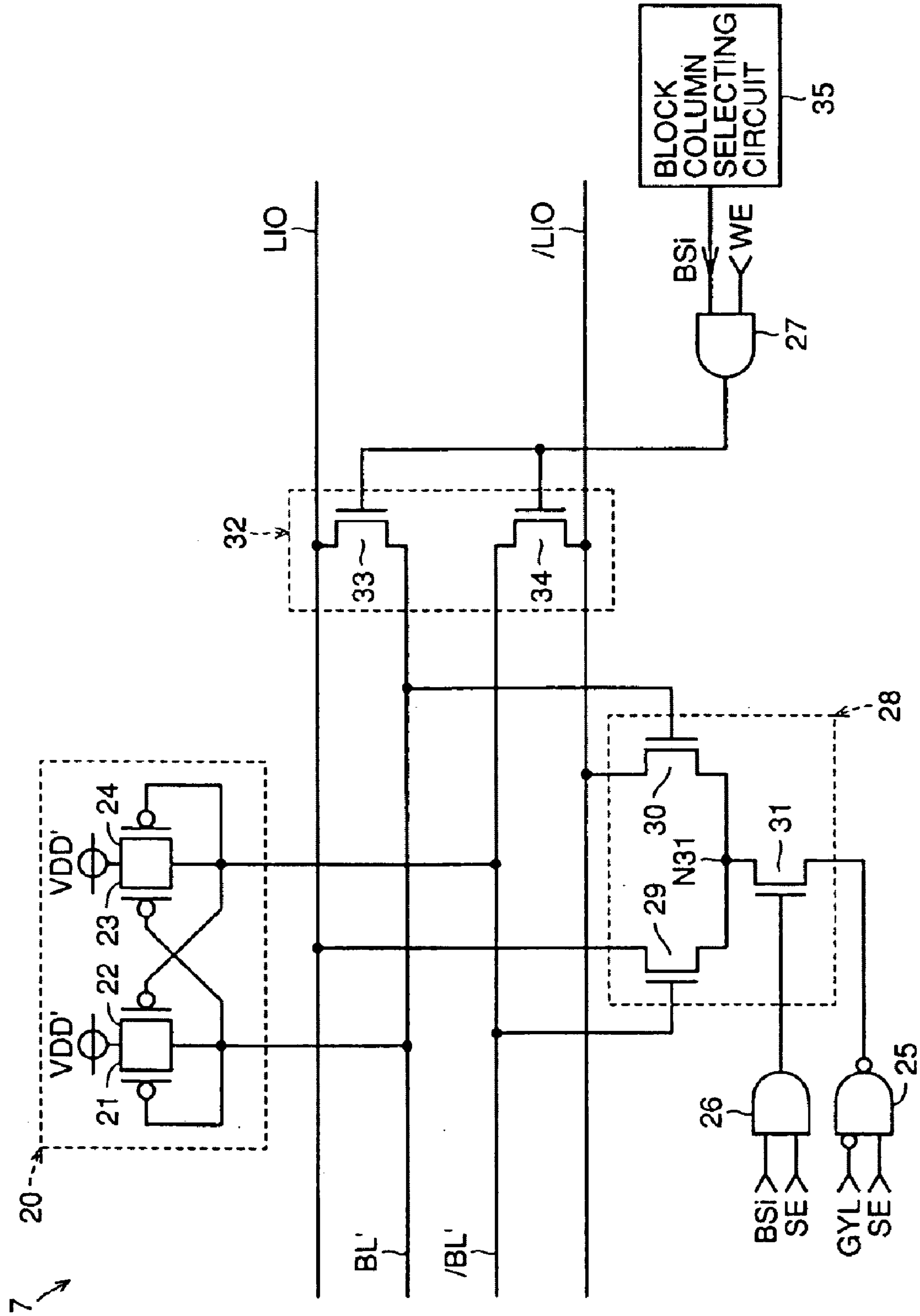
FIG. 7 is a circuit diagram showing a structure of a bit line load+data input/output control circuit illustrated in FIG. 3.

More specifically, the bit line load+data input/output control circuit 7, as shown in FIG. 7, includes a bit line load circuit 20, a gate circuit 25, AND gates 26 and 27, a sense amplifier 28 and a block selecting switch 32. The bit line load circuit 20 includes P channel MOS transistors 21 to 24. The P channel MOS transistors 21 and 22 are connected in parallel between the corresponding bit line load power supply line BVL and the bit line signal input/output line BL' and have gates connected to the bit line signal input/output line pair BL', /BL' respectively. The P channel MOS transistors 23 and 24 are connected in parallel between the corresponding bit line load power supply line BVL and the bit line signal input/output line /BL and have gates connected to the bit line signal input/output line pair BL', /BL', respectively. When the potential of the bit line signal input/output line pair BL', /BL' becomes lower than the power supply potential VDD', the P channel MOS transistors 21 to 24 are rendered conductive, so that the bit line signal input/output line pair BL', /BL' is charged to the "H" level.

The gate circuit 25' has one input node connected to the corresponding global column selecting line GYL and the other input node receiving a sense amplifier activating signal SE. The gate circuit 25 outputs a signal of the "L" level in response to the corresponding global column selecting line GYL being brought to the "L" level of the selected level and the sense amplifier activating signal SE being brought to an "H" level of the activation level. The AND gate 26 receives a block column selecting signal BSi (i: an integer not less than 1 and not more than 8) and the sense amplifier activating signal SE. Block column selecting signals BS1 to BS8 are allocated in advance to eight memory block MB columns, respectively, and generated by a block column selecting circuit 35 based on the block column selecting signal contained in an address signal. The block selecting signal BSi corresponding to a selected memory block MB among the eight memory block MB columns is brought to the "H" level of the selected level. The AND gate 27 receives the block selecting signal BSi and a write enable signal WE. The write enable signal WE is a signal to be brought to the "H" level of the activation level in writing operation.

The sense amplifier 28 includes N channel MOS transistors 29 to 31. The N channel MOS transistors 29 and 30 are connected between the local data input/output lines LIO and /LIO and a node N31, respectively, and have gates connected to the bit line signal input/output lines BL' and BL', respectively. The N channel MOS transistor 31 is connected between the node N31 and an output node of the NAND gate 25 and has a gate receiving an output signal of the AND gate 26.

The local data input/output line pair LIO, /LIO and the bit line signal input/output line pair BL', /BL' are precharged to the "H" level in advance. When a memory cell MC in the corresponding column is activated, a potential difference is generated between the bit line signal input/output lines BL' and/BL' according to storage data of the memory cell MC in question. When the potential of the bit line signal input/output line BL' is higher than that of the bit line signal input/output line /BL', the current flowing through the N channel MOS transistor 30 becomes larger than that flowing through the N channel MOS transistor 29, so that the potential of the local data input/output line /LIO becomes lower than that of the local data input/output line LIO. Conversely, when the potential of the bit line signal input/output line BL' is lower than that of the bit line signal input/output line /BL', the current flowing through the N channel MOS transistor 29 becomes larger than that flowing through the N channel MOS transistor 30, so that the potential of the; local data input/output line LIO becomes lower than that of the local data input/output line /LIO. The potential difference between the local data input/output lines LIO and /LIO becomes larger than that between the bit line signal input/output lines BL' and /BL'.

The block selecting switch 32 includes N channel MOS transistors 33 and 34. The N channel MOS transistors 33 and 34 are connected between the local data input/output line pair LIO, /LIO and the bit line signal input/output line pair BL', /BL', respectively, and have gates both receiving an output signal of the AND gate 27.

In writing operation, one of the local data input/output line pair LIO, /LIO is brought to the "H" level and the other to the "L" level in response to the write date DI. When both the block column selecting signal BSi and the write enable signal WE are brought to the "H" level, the N channel MOS transistors 33 and 34 are rendered conductive, so that the levels of the local data input/output line pain LIO, /LIO are transmitted to the corresponding bit line pair BL, /BL through the N channel MOS transistors 33 and 34 and the bit line signal input/output line pair BL', /BL'. When any of the memory cells MC in the corresponding column is activated, data is written into the memory cell MC in question.

Figure 8:
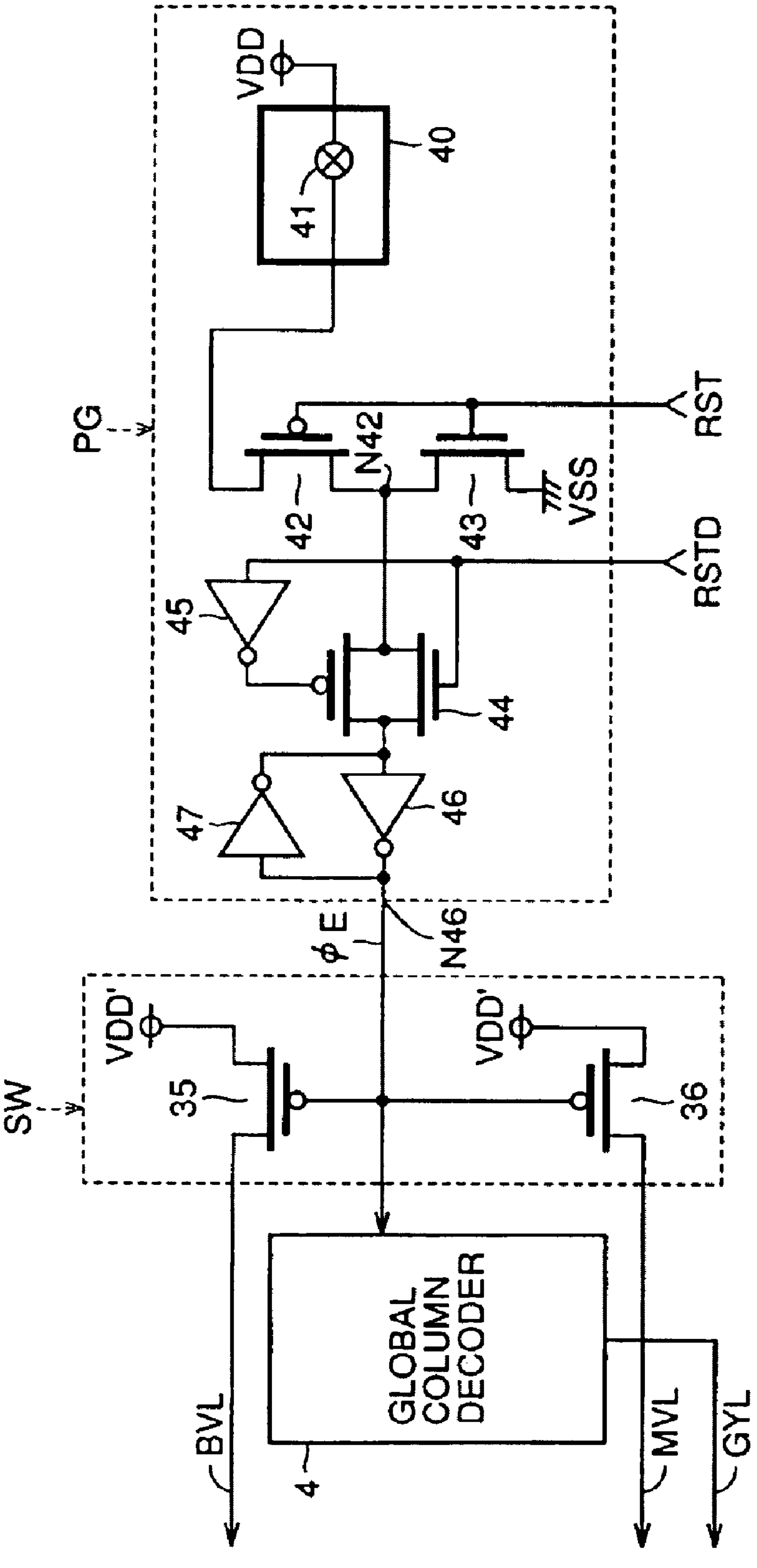
FIG. 8 is a circuit diagram showing a structure of a switch circuit SW and a program circuit PG illustrated in FIGS. 1 and 2.

Return to FIG. 2, the power supply control circuit 5 includes the switch circuit SW provided corresponding to each of the two power supply lines BVL and MVL and the program circuit PG. The switch circuit SW, as illustrated in FIG. 8, includes P channel MOS transistors 35 and 36. The P channel MOS transistors 35 and 36 are connected between the line of the power supply potential VDD', and the bit line load power supply line BVL and the memory cell power supply line MVL, respectively, and have gates both receiving an output signal ϕE of the program circuit PG.

When the signal ϕE is at the "L" level, the P channel MOS transistors 35 and 36 are rendered conductive; so that from the line of the power supply potential VDD', current is supplied to the power supply lines BVL and MVL through the P channel MOS transistors 35 and 36. When the signal ϕE is at the "H" level, the P channel MOS transistors 35 and 36 are rendered non-conductive, so that current supply from the line of the power supply potential VDD' to the power supply lines BVL and MVL is cut off. Each of the P channel MOS transistors 35 and 36 has a relatively large predetermined conductive resistance value (not less than approximate to 10 kΩ). Therefore, even when a latch-up phenomenon occurs while the P channel MOS transistors 35 and 36 are conductive, small current is enough which flows from the line of the power supply potential VDD' to the line of the ground potential VSS through the P channel MOS transistors 35 and 36 and the power supply lines BVL and MVL.

The program circuit PG includes a guard ring 40, a fuse 41, a P channel MOS transistor 42, an N channel MOS transistor 43, a transfer gate 44 and inverters 45 to 47. The fuse 41 is provided in the guard ring 40. The guard ring 40 is provided for preventing breakage of peripheral circuits of the fuse 41 due to damages at the time of laser blow and preventing water from entering the peripheral circuits through a crack caused by the blow of the fuse 41. In addition, because even the guard ring 40 is provided, a small amount of water might enter to vanish storage data of a memory cell MC, the fuse 41 and the guard ring 40 are arranged at the farthest place from the memory cell MC.

The fuse 41, the P channel MOS transistor 42 and the N channel MOS transistor 43 are connected in series between the line of the power supply potential VDD and the line of the ground potential VSS. Gates of the P channel MOS transistor 42 and the N channel MOS transistor 43 receive a reset signal RST. The reset signal RST is a signal, for example, which attains the "H" level only for a predetermined time T1 at the time of power application.

The transfer gate 44 and the inverter 46 are connected in series between a node N42 between the MOS transistors 42 and 43 and an output node N46. A signal RSTD is input directly to the gate of the transfer gate 44 on the N channel MOS transistor side, as well as input to the gate on the P channel MOS transistor side through the inverter 45. The signal RSTD is a signal obtained by delaying a reset signal RST by a predetermined time T2. The inverter 47 is connected in reverse parallel to the inverter 46. The transfer gate 44 and the inverters 45 to 47 form a latch circuit.

Although the power supply potentials VDD and VDD' are the same potential, they are applied from different pads. This arrangement is intended to facilitate analyses of defects in standby current.

Figure 9:
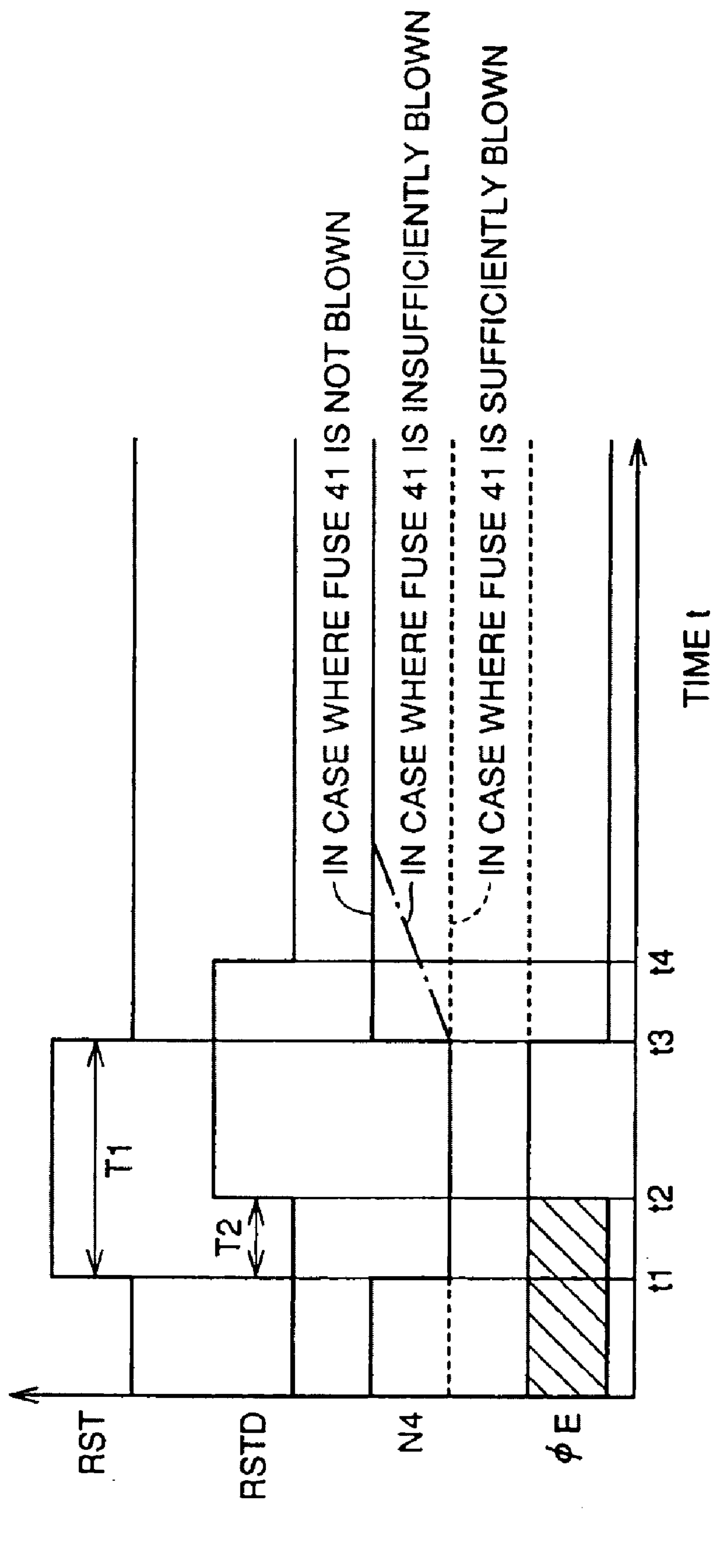
FIG. 9 is a time chart showing operation of the program circuit PG illustrated in FIG. 8.

FIG. 9 is a time chart showing operation of the program circuit PG illustrated in FIG. 8. In FIG. 9, at the initial state, the signals RST and RSTD are both at the "L" level and the P channel MOS transistor 42 is conductive, while the N channel MOS transistor 43 and the transfer gate 44 are non-conductive. At a time t1, when the reset signal RST is raised from the "L" level to the "H" level, the P channel MOS transistor 42 is rendered non-conductive and the N channel MOS transistor 43 is rendered conductive, so that the node N42 is reset at the "L" level.

Subsequently, at a time t2, when the signal RSTD is raised from the "L" level to the "H" level, the transfer gate 44 as rendered conductive to rest the signal ϕE at the "H" level. Subsequently at a time t3, when the reset signal RST is brought from the "H" level down to the "L" level, the P channel MOS transistor 42 is rendered conductive, while the N channel MOS transistor 43 is rendered non-conductive.

At this time, if the fuse 41 is not blown, the power supply potential VDD is applied to the node N42 through the fuse 41 and the P channel MOS transistor 42 to raise the node N42 from the "L" level to "H" level and bring the signal ϕE, from the "H" level down to the "L" level. On the other hand, when the fuse 41 is sufficiently blown, the node N42 remains at the "L" level and the signal ϕE remains at the "H" level. When the fuse 41 is insufficiently blown, because of a high resistance value that the insufficiently blown fuse 41 has, the potential of the node N42 is gradually increased to take a long time before exceeding a threshold potential of the inverter 46. Before the potential of the node N42 exceeds the threshold potential of the inverter 46, the signal ϕE remains at the "H" level. Subsequently at a time t4, when the signal RSTD is brought down from the "H" level to the "L" level, the transfer gate 44 is rendered non-conductive, so that the level of the signal ϕE is latched by the inverters 46 and 47.

Accordingly, when the fuse 41 is not blown, the signal ϕE attains the "L" level, while when the fuse 41 is sufficiently blown and when the same is insufficiently blown, the signal ϕE attains the "H" level.

Figure 10:
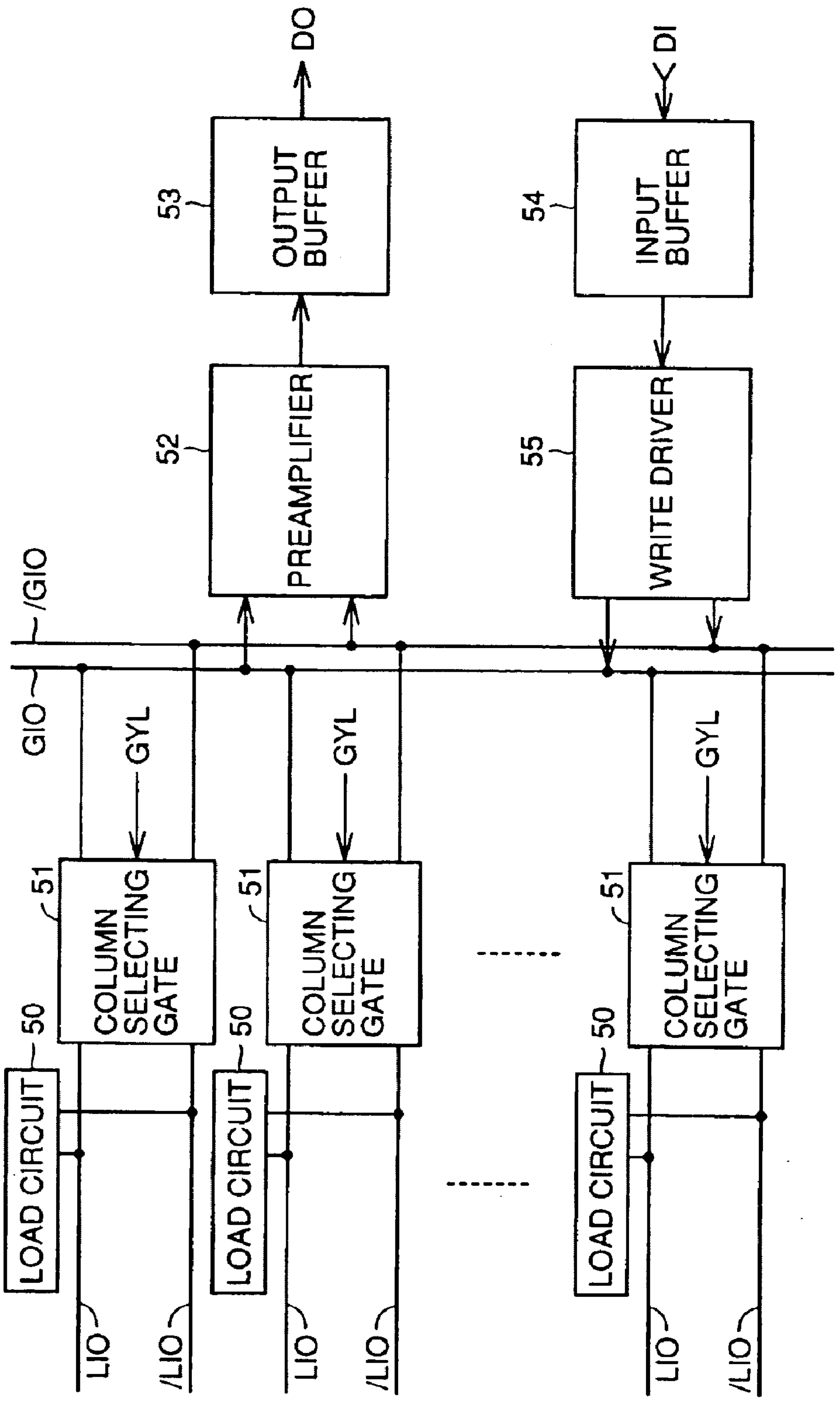
FIG. 10 is a block diagram showing a structure of a write/read circuit illustrated in FIG. 1.

FIG. 10 is a block diagram showing a structure of the write/read circuit 3 illustrated in FIGS. 1 and 2. In FIG. 10, the write/read circuit 3 includes a load circuit 50 and a column selecting gate 51 provided corresponding to each local data input/output, line pair LIO, /LIO, and a global data input/output pair GIO, /GIO.

The load circuit 50; which has the same structure as that of the bit line load circuit 20 illustrated in FIG. 7, charges the corresponding local data input/output line pair LIO, /LIO to the "H" level. The column selecting gate 51 is provided between the corresponding local data input/output line pair LIO, /LIO and the global data input/output line pair GIO, /GIO and becomes conductive in response to the corresponding global column selecting line GYL being brought to the "L" level of the selected level.

In addition, the write/read circuit 3 includes a preamplifier 52, an output buffer 53, an input buffer 54 and a write driver 55. The preamplifier 52 is activated in reading operation to compare the levels of the global data input/output lines GIO and /GIO and output a signal of a level according to the comparison result. The output buffer 53 externally outputs an output signal of the preamplifier 52 as a read data signal DO.

The input buffer 54 applies the external write data signal DI to the write driver 55. The write driver 55 brings one of the global data input/output lines GIO and /GIO to the "H" level and the other to the "L" level according to the level of the write data DI applied through the input buffer 54.

Next, operation of the SRAM shown in FIGS. 1 to 10 will be described. In writing operation, the global word line GWL corresponding to a memory block row selecting signal contained in a row address signal is brought down to the "L" level of the selected level by the global row decoder 1 to active each local row decoder 6 corresponding to the global word line GWL in question. In addition the word line WL corresponding to the memory cell row selecting signals ϕ1 to ϕ8 generated from the row address signal is raised to the "H" level of the selected level by the activated local row decoder 6, thereby activating each memory cell MC corresponding to the word line WL.

Subsequently, the write enable signal WE attains the "H" level of the activation level to render conductive the gate circuit 32 of each memory block MB corresponding to the block column selecting signals BS1 to BS8 generated from a column address signal, so that the bit line signal input/output line pair BL', /BL' of the memory block MB in question is connected to the corresponding local data input/output line pain LIO, /LIO. In addition, one global column selecting line GYL corresponding to a memory cell column selecting signal contained in the column address signal is brought to the "L" level of the selected level to render the corresponding column selecting gate 51 conductive, so that the corresponding local data input/output line pair LIO, /LIO is connected to the global data input/output line pair GIO, /GIO.

The write driver 55 brings one of the global data input/output lines GIO and /GIO to the "H" level and brings the other to the "L" level in response to the data signal DI externally applied through the input buffer 54 to write the data DI into an activated memory cell MC. When the global word line GWL and the global column selecting line GYL are raised to the "H" level of the non-selected level, data is stored in the memory cell MC in question.

In reading operation, one global column selecting line GYL corresponding to a memory cell column selecting signal contained in the column address signal is brought to the "L" level of the selected level to render the corresponding column selecting gate 51 conductive, so that the corresponding local data input/output line pain LIO, /LIO is connected to the global data input/output line pair GIO, /GIO.

Next, the global word line GWL corresponding to a memory block row selecting signal contained in the row address signal is brought down to the "L" level of the selected level by the global row decoder 1 to active each local row decoder 6 corresponding to the global word line GWL in question. In addition, the word line WL corresponding to the memory cell row selecting signals ϕ1 to ϕ8 generated from the row address signal is raised to the "H" level of the selected level by the activated local row decoder 6 to active each memory cell MC corresponding to the word line WL in question. As a result, according to data stored in the memory cell MC selected by the row decoders 1 and 6, current flows to the memory cell MC from one of the bit line pair BL, /BL, so that one of the potentials of the bit line signal input/output line pair BL', /BL' is lowered.

Subsequently, when the sense amplifier activating signal SE attains the "H" level of the activation level, the block column selecting signal BSi generated from the column address signal attains the "H" level of the activation level and one global column selecting line GYL corresponding to a memory cell column selecting signal contained in the column address signal is brought to the "L" level of the selected level, the sense amplifier 28 of the selected memory block MB is activated. As a result, a potential difference between the bit line signal input/output line pair BL', /BL' is amplified and transmitted to the global data input/output line pair GIO, /GIO. The preamplifier 52 compares the potentials of the global data input/output lines GIO and /GIO and supplies the data DO as an output according to the comparison result through the output buffer 53.

Next, a method of using the SRAM will be described. First, conduct a test to determine whether each memory cell MC is normal or not and replace a memory cell row or column including a defective memory cell MC with a spare memory cell row or column, as well as blowing the fuse 41 of the program circuit PG corresponding to a memory cell column including the defective memory cell MC.

In a memory cell column in which the fuse 41 is not blown, the output signal ϕE of the program circuit PG attains the "L" level to render the P channel MOS transistors 35 and 36 of the switch circuit SW conductive. As a result, the power supply potential VDD' is applied from the line of the power supply potential VDD' to the bit line load power supply line BVL and the memory cell power supply line MVL in the column in question through the P channel MOS transistors 35 and 36, whereby the memory cell column operates normally.

On the other hand, in a memory cell column in which the fuse 41 is fully blown and a memory cell column in which the fuse 41 is insufficiently blown, the output signal ϕE of the program circuit PG attains the "L" level to render the P channel MOS transistors 35 and 36 non-conductive. As a result, the bit line load power supply line BVL and the memory cell power supply line MVL in the column enter a floating state, whereby even when there is a shorted part in a memory cell MC in the column, no current flows to the shorted part. Accordingly, reduction in the standby current can be attained.

Since in the present embodiment, eight lines GWL, BVL, LIO, BL', /BL', /LIO, MVL and GYL are respectively arranged above eight memory cell rows of each memory block MB, it is possible to realize an SRAM having a T-type bit line structure with ease using horizontal memory cells MC.

In addition, since power supply lines BVL and WL are arranged between the global word line GWL and the global column selecting line GYL for transmitting a signal having a large amplitude and other lines BL', /BL' and LIO and /LIO for transmitting a signal having a small amplitude, respectively, reduction in coupling noise between signal lines can be also attained.

Moreover, because the eight lines GWL, BVL LIO, BL', /BL', /LIO MVL and GYL are all brought to the "H" level' at standby, even when a shorted part is generated between the lines, current flow to the shorted part can be prevented, thereby attaining reduction in standby current.

Furthermore, since the P channel MOS transistors 35 and 36 are rendered non-conductive to bring the power supply lines BVL and MVL to the floating state by blowing the fuse 41 of the program circuit PG corresponding to a defective memory cell column, current leakage from the power supply lines BVL and MVL to a shorted part of the defective memory cell MC and the like can be prevented to realize reduction in standby current.

It is also possible to prevent water entering through a crack caused by blowing of the fuse 41 from erasing storage data of a memory cell MC because the fuse 41 is provided in the guard ring 40 and arranged at an end portion of a chip.

In addition, since a pitch of the fuse 42 is determined not by semiconductor design rules but by precision of a laser trimming process such as precision of laser positioning, reduction in the pitch of the fuse 41 cannot be more enhanced than that of a line pitch. It is accordingly not practical to provide the fuse 41 for each bit line pain BL, /BL because it invites an increase in a chip area. In this embodiment, provision of the fuse 41 in common for eight pairs of bit line pairs BL, /BL results in reducing the necessary number of fuses 41 and a necessary chip area.

Figure 11:
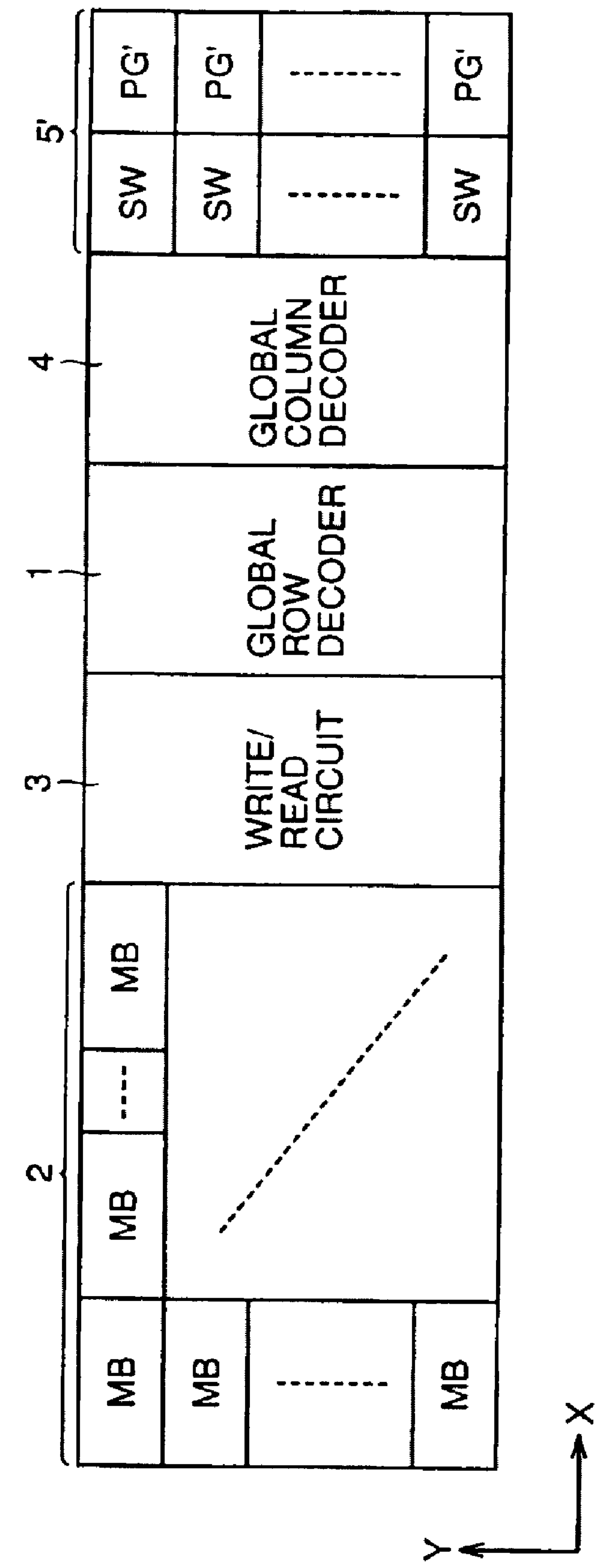
FIG. 11 is a diagram showing a modification example of the present embodiment.

FIG. 11 is a diagram showing a modification example of the present embodiment. In FIG. 11, the modification example differs from the SRAM illustrated in FIG. I in that the global row decoder 1 is arranged between the write/read circuit 3 and the global column decoder 4 and that the power supply control circuit 5 is replaced by a power supply control circuit 5'. The power supply control circuit 5' includes a switch circuit SW and a program circuit PG'.

Figure 12:
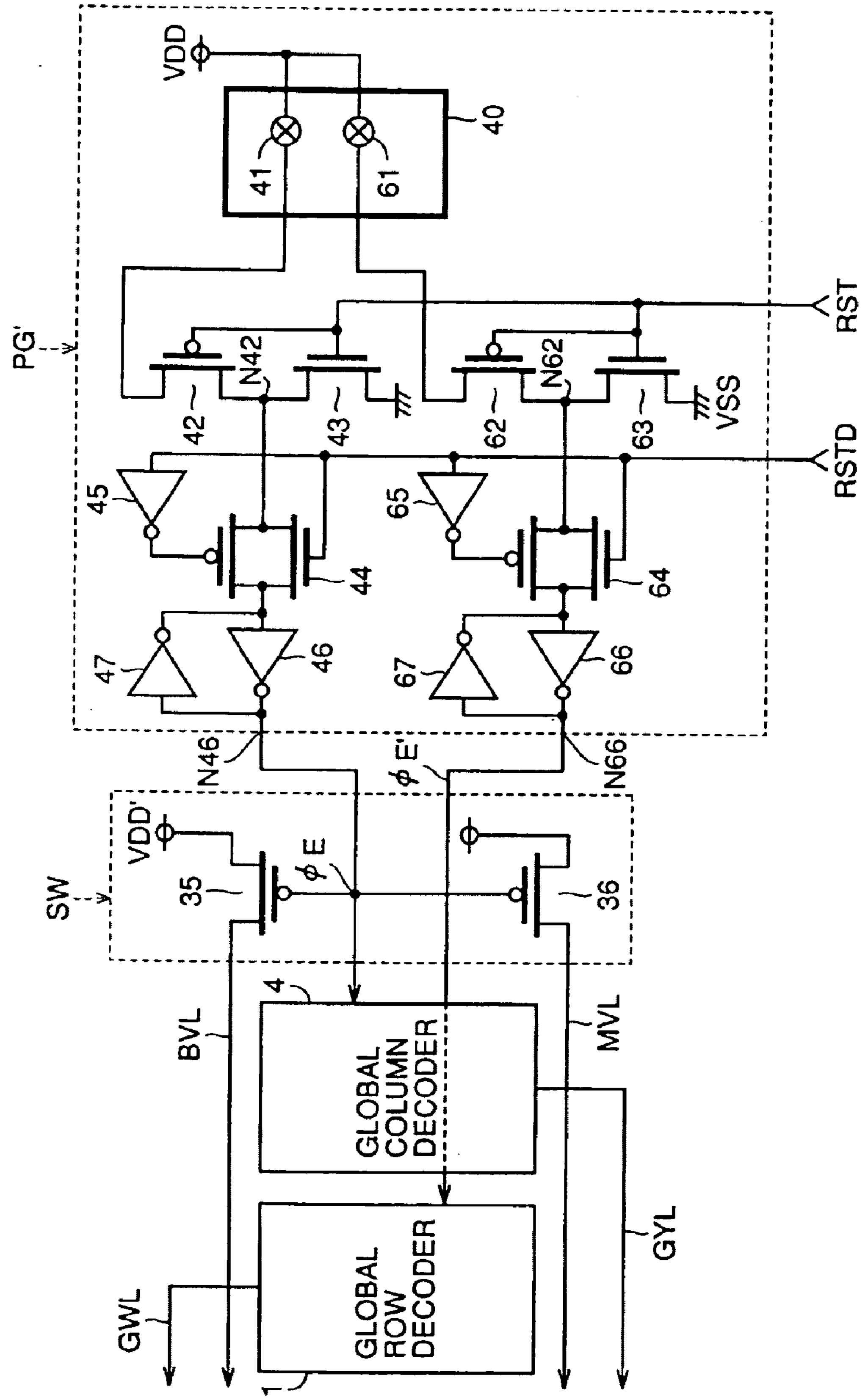
FIG. 12 is a circuit diagram showing a structure of a program circuit PG' illustrated in FIG. 11.
Figure 13A:
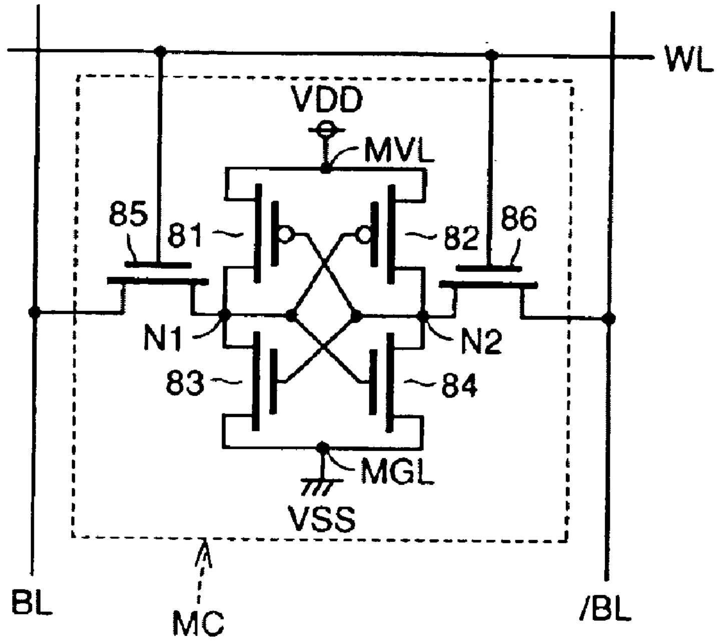
FIGS. 13A and 13B are diagrams showing a structure and layout of a conventional SRAM memory cell.
Figure 13B:
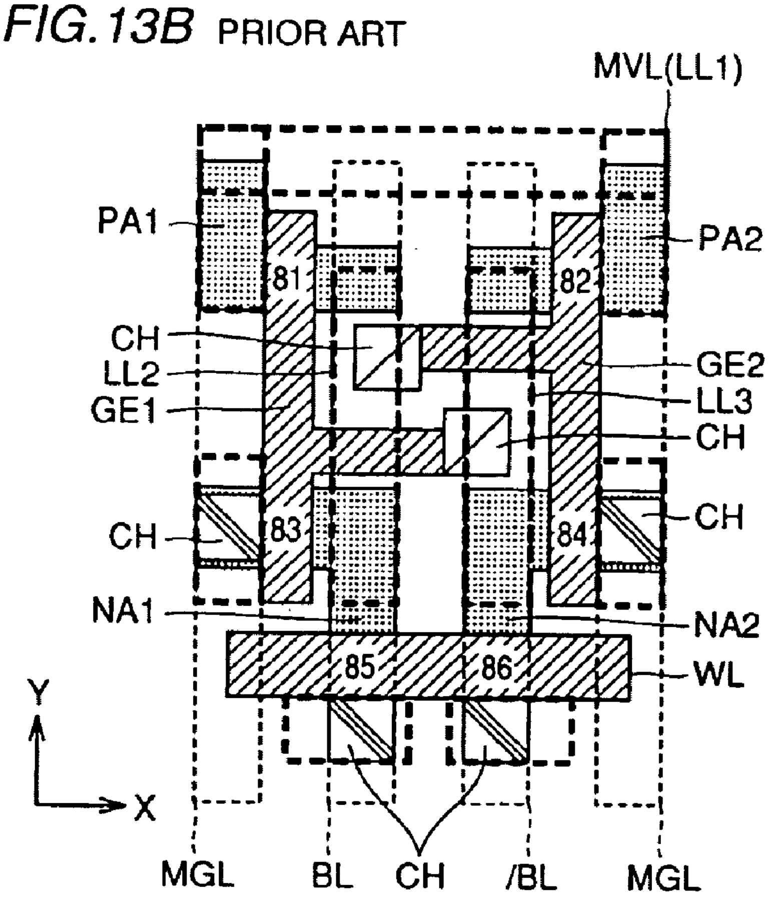

The program circuit PG', as illustrated in FIG. 12, is a circuit obtained by adding to the program circuit PG of FIG. 8, a fuse 61, a P channel MOS transistor 62, an N channel MOS transistor 63, a transfer gate 64, inverters 65 to 67 and nodes N62 and N66. The fuse 61, the P channel MOS transistor 62, the N channel MOS transistor 63, the transfer gate 64, the inverters 65 to 67 and the nodes N62 and N66 are connected in the same manner as the fuse 41, the P channel MOS transistor 42, the N channel MOS transistor 43, the transfer gate 44, the inverters 45 to 47 and the nodes N42 and M46.

The fuses 41 and 61 are arranged in the guard ring 40. The fuse 41 as described above, is protruded for each of the two power supply lines BVL and MVL. The fuse 61 is provided corresponding to each global word line GWL. The fuse 61 is blown when the corresponding memory block row is defective. When the fuse 61 is blown, the corresponding global word line GWL is fixed at the "H" level of the non-selected level by the global row decoder 1. As a result, activation of a memory cell MC in a defective memory block row can be prevented. In addition, even when the global word line GWL is shorted with the bit line load power supply line BVL, current leakage through the shorted part can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device, comprising:

a number M×N (M: integer not less than 2; N: integer not less than 2) of memory blocks each of which include a number 8×M of horizontal memory cells arranged in eight rows by M columns and which are arranged in M rows by N columns, a word line provided corresponding to each memory cell row of each memory block, first and second bit lines provided in common for the number M of memory block rows so as to correspond to each memory cell column, first and second bit line signal input/output lines provided corresponding to each memory block and connected to the first and second bit lines of a predetermined pair of the corresponding M pairs of the first and second bit lines, respectively, first and second data input/output lines provided corresponding to each memory block row for inputting/outputting data of the corresponding memory block row, first and second power supply lines provided corresponding to each memory block row, a global word line provided corresponding to each memory block row for selecting the corresponding memory block row, a global column selecting line provided in common for the number M×N of memory blocks so as to correspond to each memory cell column for selecting the corresponding memory cell column, a selection circuit responsive to an address signal for driving said word line, said global word line and said global column selecting line to select any one memory block of said number M×N of memory blocks and any one memory cell of the number 8×M of memory cells belonging to the memory block, a write/read circuit for writing/reading data of said memory cell, and a gate circuit for coupling a memory cell selected by said selection circuit to said write/read circuit through said first and second bit lines, said first and second bit line signal input/output lines and said first and second data input/output lines, wherein in each memory block column, the M sets of said first and second bit line signal input/output lines, said first and second data input/output lines, said first and second power supply lines, said global word lines and said global column selecting line are arranged above the number M of memory blocks respectively, and extend in the same direction as that of said word line, each set of said first and second bit line signal input/output lines, said first and second data input/output lines, said first and second power supply lines and said global word lines and said global column selecting lines are arranged above eight memory cell rows included in the corresponding memory block, respectively, said first power supply line is arranged between said first and second bit line signal input/output lines and said first and second data input/output lines, and said global word line, and said second power supply line is arranged between said first and second bit line signal input/output lines and said first and second data input/output lines, and said global column selecting line.

2. The static semiconductor memory device according to claim 1, wherein the M pairs of the first and second power supply lines are provided corresponding to the M pairs of the first and second bit lines in each memory block column, and which further comprises:

a bit line load circuit provided corresponding to each memory block for applying a power supply potential applied through the corresponding first power supply line to the corresponding first and second bit line signal input/output lines, and a third power supply line provided corresponding to each of the first and second bit lines for applying said power supply potential applied through the corresponding second power supply line to each corresponding memory cell.

3. The static semiconductor memory device according to claim 2, wherein a redundant system of replacing a defective memory cell row or column by a spare memory cell row or column is adopted, and which further comprises:

a first switching element provided corresponding to each first power supply line and having one electrode connected to the corresponding first power supply line and the other electrode receiving said power supply potential, a second switching element provided corresponding to each second power supply line and having one electrode connected to the corresponding second power supply line and the other electrode receiving said power supply potential, and a first program circuit provided corresponding to each of the first and second power supply lines and including a first fuse which is to be blown when the corresponding memory cell column is defective, and responsive to blowing of the first fuse for rendering the corresponding first and second switching elements non-conductive.

4. The static semiconductor memory device according to claim 3, wherein said selection circuit includes:

a global column decoder responsive to said address signal for selecting any one global column selecting line of the number M of global column selecting lines to bring the global column selecting line to a selected level, and a global row decoder responsive to said address signal for selecting any one global word line of the number M of global word lines to bring the global ward line to the selected level; and said first program circuit further controls said global column decoder to fix the corresponding global column selecting line at a non-selected level in response to said first fuse being blown.

5. The static semiconductor memory device according to claim 4, wherein other part of said first program circuit than said first fuse and said global column decoder are arranged between said first fuse and said memory block.

6. The static semiconductor memory device according to claim 4, further comprising a second program circuit provided corresponding to each global word line and including a second fuse which is to be blown when the corresponding memory block row is defective, and responsive to blowing of the second fuse for controlling said global row decoder to fix the corresponding global word line at the non-selected level.

7. The static semiconductor memory device according to claim 6, wherein other part of said first and second program circuits than said first and second fuses, said global column decoder and said global row decoder are arranged between said first and second fuses and said memory block.

* * * * *